(12) United States Patent
Duvvury et al.

(10) Patent No.: US 6,633,468 B1
(45) Date of Patent: Oct. 14, 2003

(54) HIGH VOLTAGE PROTECTION CIRCUIT FOR IMPROVED OXIDE RELIABILITY

(75) Inventors: Charvaka Duvvury, Plano, TX (US); Bernhard H. Andresen, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 301 days.

(21) Appl. No.: 09/610,170

(22) Filed: Jul. 5, 2000

Related U.S. Application Data

(60) Provisional application No. 60/154,886, filed on Sep. 20, 1999, and provisional application No. 60/150,091, filed on Aug. 20, 1999.

(51) Int. Cl.⁷ .............................................. H03K 5/08
(52) U.S. Cl. ........................ 361/56; 361/111; 361/91.1; 361/115
(58) Field of Search .................... 361/111, 56, 91.1, 361/115, 118, 18, 127

(56) References Cited

U.S. PATENT DOCUMENTS

| | | | |
|---|---|---|---|
| 4,692,781 A | 9/1987 | Rountree et al. | 357/23.13 |
| 4,855,620 A | 8/1989 | Duvvury et al. | 307/448 |
| 4,939,616 A | 7/1990 | Rountree et al. | 361/56 |
| 6,137,696 A | * 10/2000 | Hall et al. | 323/902 |
| 6,147,538 A | * 11/2000 | Andresen et al. | 327/309 |
| 6,369,998 B1 | * 4/2002 | Anderson | 261/118 |

OTHER PUBLICATIONS

"ESD: A Pervasive Reliability Convern for IC Technologies", Proceedings of the IEEE. vol. 81, No. 5, May 1993, pp. 690–702 (Charvaka Duvvury, Member IEEE and Ajith Amerasekera, Member IEEE).

"EOS/ESD Reliability of Deep Sub–Micron NMOS Protection Devices", pp. 284–291 (Sridhar Ramaswamy, charvaka Duvvury and Sung–Mo Kang).

* cited by examiner

Primary Examiner—Bao Q. Vu

(57) ABSTRACT

A structure is designed with an external terminal (100) and a reference terminal (130). A first transistor (106) has a current path coupled to the external terminal and has a first control terminal (114). A second transistor (110) has a current path coupled between the current path of the first transistor and the reference terminal and has a second control terminal (126). A bias circuit comprises a third transistor (116) having a first conductivity type and a fourth transistor (124) having a second conductivity type. The third and fourth transistors have respective current paths coupled in series to the reference terminal. The bias circuit is arranged to produce a first voltage at the first control terminal and a second voltage different from the first voltage at the second control terminal.

13 Claims, 2 Drawing Sheets

HIGH VOLTAGE PROTECTION CIRCUIT FOR IMPROVED OXIDE RELIABILITY

CLAIM TO PRIORITY OF PROVISIONAL APPLICATION

This application claims priority under 35 U.S.C. § 119(e)(1) of provisional application Ser. No. 60/154,886, filed Sep. 20, 1999 and provisional application Ser. No. 60/150,091, filed Aug. 20, 1999, the entirety of which is incorporated herein by reference. This application claims priority under 35 U.S.C. § 120 of nonprovisional application Ser. No. 09/325,530, filed Jun. 03, 1999, now U.S. Pat No. 6,147,538, the entirety of which is incorporated herein by reference.

FIELD OF THE INVENTION

This invention relates to an integrated circuit and more particularly to a protection circuit for an integrated circuit with high voltage input signals and improved oxide reliability.

BACKGROUND OF THE INVENTION

Present complementary metal oxide semiconductor (CMOS) and bipolar-CMOS (BiCMOS) circuits employ electrostatic discharge protection (ESD) circuits to protect against electrostatic discharge due to ordinary human and machine handling. This electrostatic discharge occurs when the semiconductor circuit contacts an object that is charged to a substantially different electrostatic potential of typically several thousand volts. The contact produces a short-duration, high-current transient in the semiconductor circuit. This high current transient may damage the semiconductor circuit through joule heating. Furthermore, high voltage developed across internal components of the semiconductor circuit may damage MOS transistor gate oxide.

Sensitivity of the semiconductor circuit is determined by various test methods. A typical circuit used to determine sensitivity of the semiconductor circuit to human handling includes a capacitor and resistor that emulate a human body resistor-capacitor (RC) time constant. The capacitor is preferably 100 pF, and the resistor is preferably 1500 Ω, thereby providing a 150-nanosecond time constant. A semiconductor device is connected to the test circuit at a predetermined external terminal for a selected test pin combination. In operation, the capacitor is initially charged to a predetermined stress voltage and discharged through the resistor and the semiconductor device. A post stress current-voltage measurement determines whether the semiconductor device is damaged. Although this test effectively emulates electrostatic discharge from a human body, it fails to comprehend other common forms of electrostatic discharge.

A charged-device ESD test is another common test method for testing semiconductor device sensitivity. This method is typically used to determine sensitivity of the semiconductor circuit to ESD under automated manufacturing conditions. The test circuit includes a stress voltage supply connected in series with a current limiting resistor. The semiconductor device forms a capacitor above a ground plane that is typically 1–2 pF. A low impedance conductor forms a discharge path having an RC time constant typically two orders of magnitude less than a human body model ESD tester. In operation, the semiconductor device is initially charged with respect to the ground plane to a predetermined stress voltage. The semiconductor device is then discharged at a selected terminal through the low impedance conductor. This connection produces a high-voltage, high-current discharge in which a magnitude of the initial voltage across the semiconductor device approaches that of the initial stress voltage.

A particular problem of protection circuit design arises when high voltage signals having a magnitude greater than the supply voltage are applied to an integrated circuit during normal operation. These high voltage signals require special circuit design techniques to avoid gate oxide stress due to a relatively high electric field. These special design techniques must be included in protection circuit design as well, because the protection circuit must remain inactive in response to the high voltage signals during normal operation yet operative in response to either human body or charged-device ESD stress. Referring to FIG. 4, there is an ESD protection circuit of the prior art including series-connected metal oxide semiconductor (MOS) transistors 400 and 402 arranged to conduct the ESD current between bond pad 100 and $V_{SS}$ supply terminal 130. The control gates of these MOS transistors are held at ground or $V_{SS}$ potential by resistors $R_1$ 406 and $R_2$ 410 during normal circuit operation. The series connection of MOS transistors produces a higher activation voltage for the protection circuit that is greater than the normal high voltage signals. The series connected MOS transistors, therefore, remain inactive in response to normal high voltage signals at bond pad 100. Application of ESD stress at bond pad 100, however, capacitively couples a greater voltage at the bond pad 100 to leads 404 and 408 via the parasitic MOS gate-drain capacitance that is sufficient to induce conduction of the MOS transistors. The resulting conduction of ESD current through MOS transistors 400 and 402 limits the maximum voltage on lead 102, thereby protecting circuit 104.

A problem with this protection design arises from the high electric field across MOS transistor 400 during normal operation. Since lead 404 remains at ground or $V_{SS}$ potential during normal operation, the high voltage signals at lead 102 produce a high electric field across the gate oxide of MOS transistor 400 between drain 102 and gate 404 terminals. MOS transistor 400 is typically designed with the same gate oxide thickness as other MOS transistors on the integrated circuit to comprehend a normal supply voltage level. Thus, the high electric field due to the high voltage signals contributes to premature degradation of MOS transistor 400 during normal circuit operation. This degradation may take the form of transistor threshold variation or transistor gain variation as is well known in the art.

Referring now to FIG. 5, there is a protection circuit of the prior art as disclosed in U.S. Pat. No. 5,930,094, filed Aug. 26, 1998. This protection circuit provides bias circuits G1 504 and G2 506 to divide the supply voltage $V_{DD}$ at lead 120 between leads 404 and 408 during normal circuit operation. In particular, the '094 patent teaches that the voltage at lead 408 should be about equal to a threshold voltage and that the voltage at lead 404 should be two P-channel threshold voltages below the $V_{DD}$ supply voltage. At feast one of MOS transistors 400 and 402 remains off, therefore, during normal circuit operation. This circuit advantageously divides the high voltage signals at bond pad 100 across the gate oxide of MOS transistors 400 and 402, thereby eliminating premature MOS transistor degradation.

In operation, application of ESD stress at bond pad 100 causes ESD stress current to flow through diode D1 500. This ESD stress current charges the parasitic integrated circuit capacitance $C_C$ 502 between voltage supplies $V_{DD}$ 120 and $V_{SS}$ 130. The resulting voltage on voltage supply $V_{DD}$ 120 powers bias circuits G1 504 and G2 506 which, in turn, apply voltage to control gates of MOS transistors 400 and 402. The series circuit of MOS transistors 400 and 402 consequently conducts the ESD current, thereby protecting the protected circuit 104.

Although this protection circuit reduces the problem of premature MOS gate oxide stress during normal operation, it has significant disadvantages. First, diode D1 limits the maximum high voltage signal at bond pad 100 to one forward-biased diode drop above supply voltage $V_{DD}$. Second, the bias circuits depend on voltage coupled to $V_{DD}$ through diode D1 for proper operation. Third, the time required to charge capacitor $C_C$ limits minimum response time of the protection circuit. Finally, both of bias circuits G1 and G2 include static current paths (FIG. 4 of '094 patent) between voltage supply terminals $V_{DD}$ and $V_{SS}$ that increase standby current of the integrated circuit during normal operation.

SUMMARY OF THE INVENTION

These problems are resolved by a structure with an external terminal and a reference terminal. A first transistor has a current path coupled to the external terminal and has a first control terminal. A second transistor has a current path coupled between the current path of the first transistor and the reference terminal and has a second control terminal. A bias circuit comprises a third transistor having a first conductivity type and a fourth transistor having a second conductivity type. The third and fourth transistors have respective current paths coupled in series to the reference terminal. The bias circuit is arranged to produce a first voltage at the first control terminal and a second voltage different from the first voltage at the second control terminal.

The present invention eliminates premature gate oxide degradation in a protection circuit due to high voltage signals. No active transistor current is conducted in a normal or standby mode.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 1:
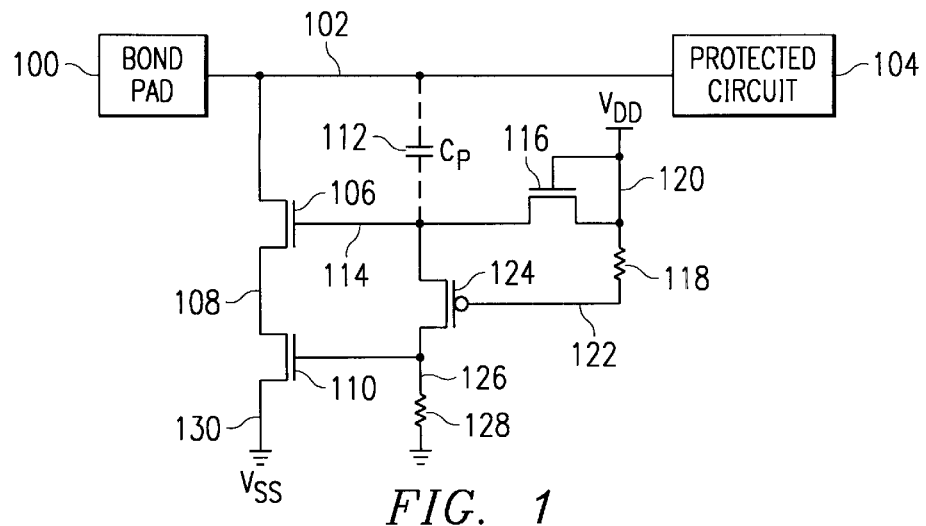
FIG. 1 is a schematic diagram of a first embodiment of a protection circuit of the present invention.

The circuit of FIG. 1, is a schematic diagram of a first embodiment of a protection circuit of the present invention. The protection circuit protects a protected circuit 104, which may be a digital signal processing integrated circuit, a memory integrated circuit or other integrated circuit. The protection circuit includes a first N-channel metal-oxide-semiconductor (MOS) transistor 106 connected to an external terminal or bond pad 100. A second N-channel transistor 110 is connected between transistor 106 and a reference terminal $V_{SS}$ 130. A bias circuit, including series-connected N-channel transistor 116 and P-channel transistor 124, are coupled between $V_{DD}$ supply voltage terminal 120 and $V_{SS}$ reference terminal 130 through resistor 128. Another resistor 118 is coupled between supply voltage terminal 120 and gate terminal 122 of P-channel transistor 124. A parasitic capacitor $C_P$ 112 formed by the gate-to-drain overlap of N-channel transistor 106 is shown connected between leads 102 and 114 by a dashed line.

In normal operation, the $V_{DD}$ supply voltage terminal 120 receives a supply voltage of preferably 3.3 volts with respect to the $V_{SS}$ supply voltage terminal 130. The external terminal 100 receives external signals that may include high voltage signals having a maximum voltage of preferably 5.8 volts. The N-channel transistor 116 is connected as a diode having control gate and drain connected to $V_{DD}$ supply voltage terminal 120. In this configuration, N-channel transistor 116 applies a voltage at terminal 114 that is one N-channel transistor threshold voltage or preferably 0.8 volts below the supply voltage at terminal 120. The maximum drain-to-gate voltage of transistor 106, therefore, is a difference between 5.8 volts and 2.5 volts or preferably 3.3 volts. N-channel transistor 106 consequently applies a voltage at terminal 108 that is one N-channel transistor threshold voltage below the control gate voltage at terminal 114 or preferably 1.7 volts. P-channel transistor 124 has a control gate coupled to the $V_{DD}$ supply voltage terminal 120 and is, therefore, off due to a gate-to-source voltage (0.8 volts) that is greater than a P-channel transistor threshold voltage of preferably −0.9 volts. The control gate of N-channel transistor 110 is biased at 0.0 volts by resistor 128, which is preferably 10 k Ω. The maximum drain-to-gate voltage of transistor 110, therefore, is preferably 1.7 volts. Thus, the bias circuit formed by N-channel transistor 116, P-channel transistor 124 and resistors 118 and 128 produce control gate voltages that turn off N-channel transistors 106 and 110 during normal operation, thereby eliminating active transistor current during normal mode operation. This is highly advantageous in minimizing integrated circuit power dissipation in a standby or sleep mode. Moreover, the bias circuit divides the high voltage signal at bond pad 100 so that a maximum voltage across the gate oxide of either of N-channel transistors 106 and 110 is preferably no more than the supply voltage $V_{DD}$. Thus, the maximum resulting electric field in the gate dielectric of either of N-channel transistors 106 and 110 is no greater than in transistors of the protected circuit 104. This is highly advantageous in eliminating premature gate dielectric wear out and degraded transistor characteristics.

Application of an ESD transient voltage at bond pad 100 produces a voltage on lead 102 that is substantially greater than the normal high voltage signals. This ESD voltage capacitively couples preferably at least 5 volts to lead 114 via parasitic capacitor $C_P$ 112 for a final voltage of preferably at least 7.5 volts. This voltage produces a reverse bias condition of diode-configured N-channel transistor 116, thereby electrically isolating lead 114 from supply voltage terminal 120. This voltage on lead 114 also turns on N-channel transistor 106 and P-channel transistor 124. P-channel transistor 124 conducts discharge current from parasitic capacitor $C_P$ through resistor 128. The discharge current through resistor 128 develops a transient voltage at terminal 126 that is sufficient to turn on N-channel transistor 110.

Figure 6:
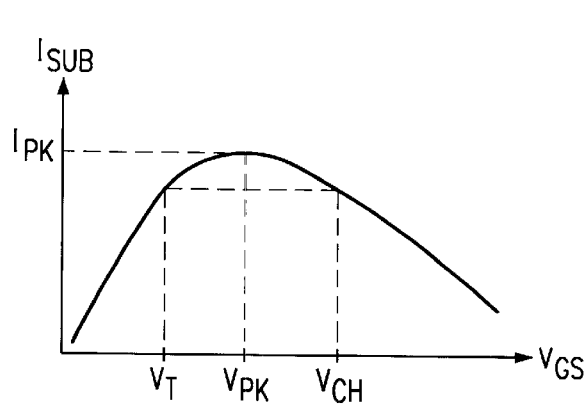
FIG. 6 is a diagram of MOS transistor substrate current as a function of MOS transistor gate-to-source voltage.
Figure 7:
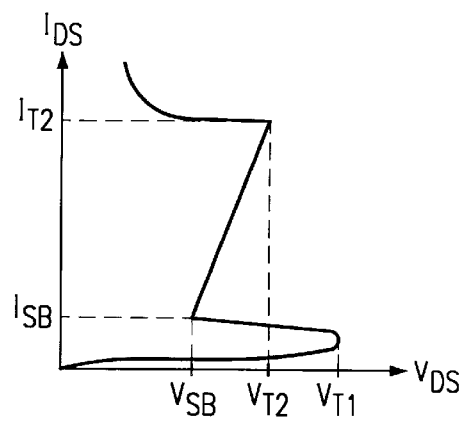
FIG. 7 is a diagram of MOS transistor drain-to-source current as a function of drain-to-source voltage.

Conduction of the ESD current through a discharge path formed by series-connected N-channel transistors 106 and 110 will now be explained in detail with reference to FIG. 6 and FIG. 7. The transient voltage coupled to the respective gates of N-channel transistors 106 and 110 increases substrate current as a function of gate-to-source voltage as illustrated at FIG. 6. P-channel transistor 124 and resistor 128, therefore, are selected to preferably couple at least a gate-to-source voltage $V_{PK}$ sufficient to temporarily form an inversion layer within each transistor channel. This inversion layer within each of N-channel transistors 106 and 110 produces respective peak substrate currents $I_{PK}$ at voltage $V_{PK}$. Each of these N-channel transistors 106 and 110 includes a parasitic NPN bipolar transistor having a collector corresponding to the drain, a base corresponding to the substrate or bulk and an emitter corresponding to the source as is well known in the art. This substrate current acts as a base-emitter current to subsequently activate the parasitic NPN transistors corresponding to N-channel transistors 106 and 110, respectively. Each N-channel transistor and parasitic NPN transistor conducts as illustrated at FIG. 7. The drain-to-source voltage $V_{DS}$ increases to $V_{T1}$ with minimal drain-to-source current $I_{DS}$. At voltage $V_{T1}$, however, $V_{DS}$ snaps back to voltage $V_{SB}$ and current $I_{SB}$. This snap back corresponds to a transition of the parasitic NPN transistor from the open-emitter collector-base breakdown voltage $BV_{CBO}$ to the open-base collector-emitter breakdown voltage $BV_{CEO}$. The parasitic NPN transistors continue to conduct ESD discharge current in the region of the curve between current $I_{SB}$ at voltage $V_{SB}$ and current $I_{T2}$ at voltage $V_{T2}$ until the voltage at lead 102 decreases below a conduction threshold. The circuit then returns to a stable state previously described.

Figure 5:
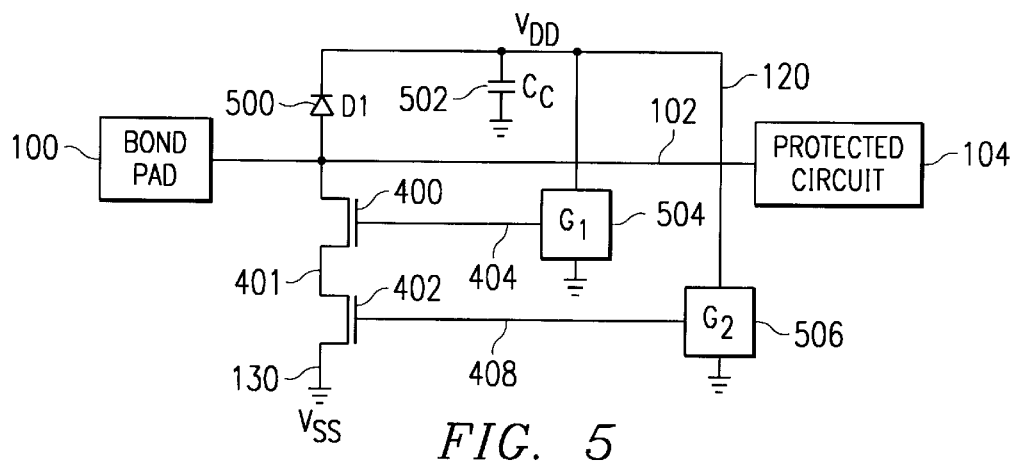
FIG. 5 is a schematic diagram of another protection circuit of the prior art.

Several operating characteristics of this protection circuit are highly advantageous. First, both N-channel transistors conduct ESD current in snap back mode. Power dissipation of the protection circuit is minimized, therefore, since voltage $V_{SB}$ is substantially less than voltage $V_{T1}$. Second, the gate bias circuit for N-channel transistors 106 and 110 does not require charging of parasitic capacitance $C_C$ (FIG. 5) as in the prior art. Protection circuit activation and conduction time is greatly reduced. This is particularly advantageous for fast transients encountered during charged-device ESD stress. Third, the bias circuit does not conduct static current during normal operation. Thus, standby current is greatly reduced, thereby extending battery life for many low-power applications. Finally, high voltage signals at bond pad 100 or other external terminals are divided across the gate dielectric of N-channel transistors 106 and 110. Thus, the maximum electric field in either gate dielectric is no more than in other transistors of the protected circuit.

Figure 2:
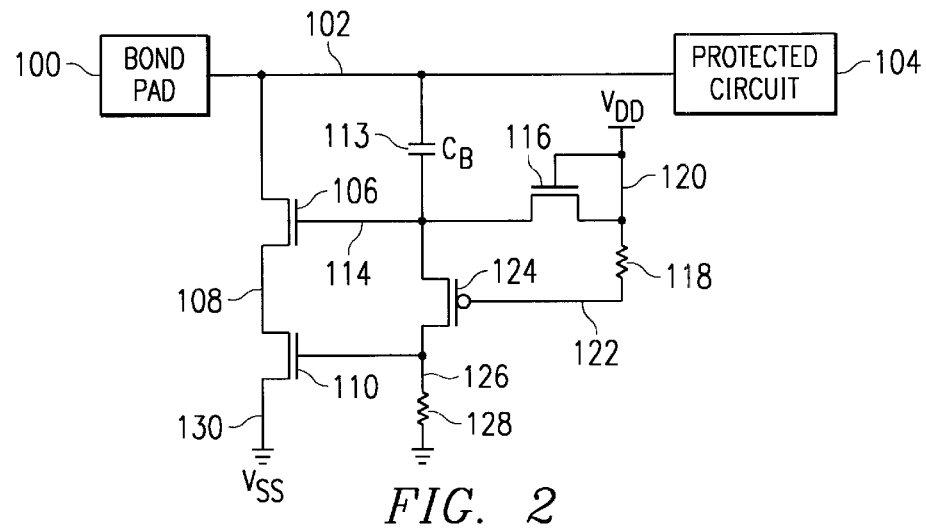
FIG. 2 is a schematic diagram of a second embodiment of a protection circuit of the present invention.

Turning now to FIG. 2, there is a second embodiment of a protection circuit of the present invention. This embodiment is the same as the protection circuit of FIG. 1 except that capacitor $C_B$ 113 is connected between lead 102 and lead 114 in addition to parasitic capacitor $C_P$ (not shown). This additional capacitance provides greater capacitive coupling to the respective control gates of N-channel transistors 106 and 110. This greater capacitive coupling increases the peak gate-to-source voltage $V_{GS}$ (FIG. 6) and time of the respective gate voltage transients above voltage $V_{PK}$. A corresponding increase in substrate current ensures proper activation of both N-channel transistors 106 and 110 over a wide range of design parameters during ESD stress.

Figure 3:
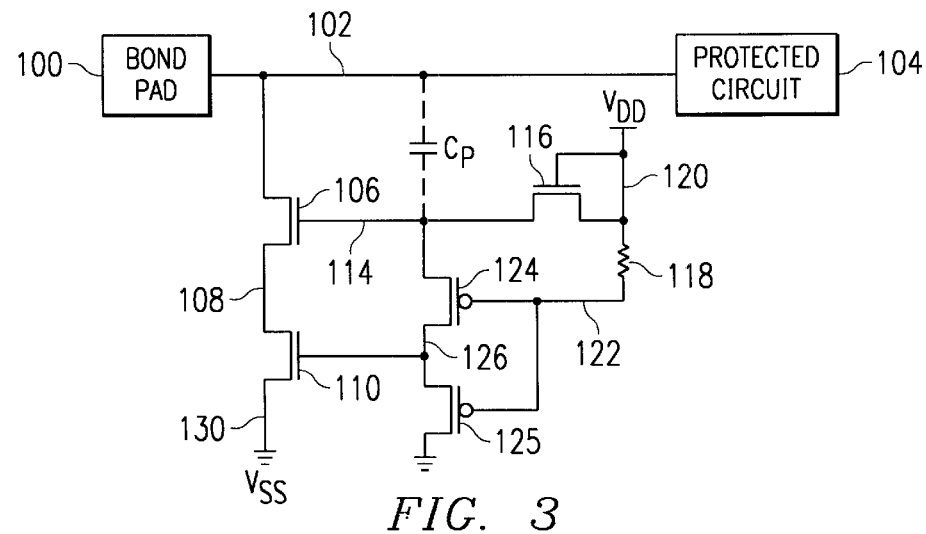
FIG. 3 is a schematic diagram of a third embodiment of a protection circuit of the present invention.
Figure 4:
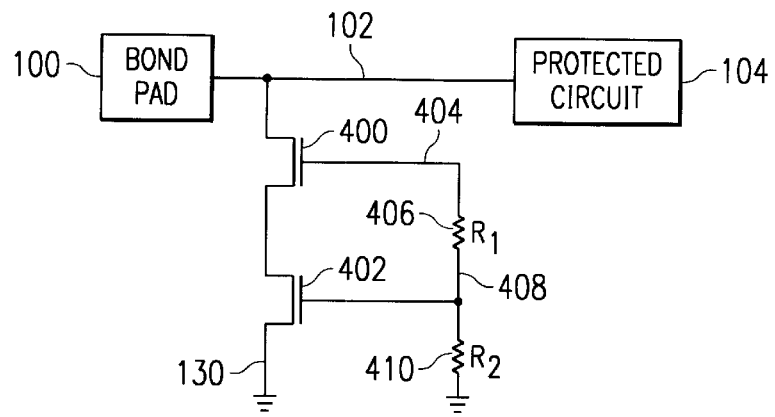
FIG. 4 is a schematic diagram of a protection circuit of the prior art.

Referring now to FIG. 3, there is a schematic diagram of a third embodiment of a protection circuit of the present invention. This embodiment is the same as the protection circuit of FIG. 1 except that resistor 128 has been replaced by P-channel transistor 125. In operation gate terminal 126 is initially at $V_{SS}$ or ground potential due to sub-threshold leakage of P-channel transistor 125. Otherwise, operation of the circuit is the same as previously described with respect to the embodiment of FIG. 1 until P-channel transistor 124 turns on. When P-channel transistor 124 begins conducting, it electrically connects terminal 114 to terminal 126. P-channel transistor 125, however, remains off until the voltage at terminal 126 is a P-channel transistor threshold voltage or preferably 0.9 volts greater than the voltage at gate terminal 122. This ensures that the gate-to-source voltage $V_{GS}$ of N-channel transistor 110 is greater than a threshold voltage $V_T$ (FIG. 6), thereby providing sufficient substrate current to activate both N-channel transistors 106 and 110.

Although the invention has been described in detail with reference to its preferred embodiments, it is to be understood that this description is by way of example only and is not to be construed in a limiting sense. For example, an N-channel transistor 125 may be substituted for the P-channel transistor 125 of FIG. 3. In this configuration, N-channel transistor 125 remains on due to the $V_{DD}$ potential at terminal 122 and fixes terminal 126 at ground ($V_{SS}$) potential during normal circuit operation. P-channel transistor 124 remains off, and N-channel transistor 116 applies a voltage at terminal 114 that is one N-channel transistor threshold voltage or preferably 0.8 volts below the supply voltage at terminal 120. Otherwise, this embodiment of the circuit of FIG. 3 operates as previously described. Moreover, various combinations of resistors and capacitors of the previous embodiments may be combined to provide the advantages of the present invention as will be appreciated by one of ordinary skill in the art having access to the instant specification. Furthermore, the inventive concept of the present invention may be advantageously extended to many parallel transistors in a semiconductor body without current hogging. Finally, advantages of the present invention may be realized by any voltage division of high voltage signals that reduce a maximum electric field across gate dielectric regions.

It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:
1. A structure, comprising:
an external terminal;
a supply voltage terminal;
a reference terminal;
a first transistor having a current path coupled to the external terminal and having a first control terminal;
a capacitor coupled between the external terminal and the first control terminal;
a second transistor having a current path coupled between the current path of the first transistor and the reference terminal and having a second control terminal; and
a bias circuit coupled between the supply voltage terminal and the reference terminal, the bias circuit arranged to produce a first voltage at the first control terminal and a second voltage different from the first voltage at the second control terminal, wherein the bias circuit comprises a third transistor having a first conductivity type and a fourth transistor having a second conductivity type, the fourth transistor having a current path coupled between the first control terminal and the second control terminal.

2. A structure as in claim 1, wherein the third transistor has a control terminal coupled to the supply voltage terminal.

3. A structure as in claim 1, further comprising a resistor connected between the supply voltage terminal and a control terminal of the fourth transistor.

4. A structure, comprising:

an external terminal;

a reference terminal;

a first transistor having a current path coupled to the external terminal and having a first control terminal;

a second transistor having a current path coupled between the current path of the first transistor and the reference terminal and having a second control terminal; and a bias circuit comprising a third transistor having a first conductivity type and a fourth transistor having a second conductivity type, the third and fourth transistors having respective current paths coupled in series to the reference terminal, the bias circuit arranged to produce a first voltage at the first control terminal and a second voltage different from the first voltage at the second control terminal, wherein the current path of the fourth transistor is coupled between the first control terminal and the second control terminal.

5. A structure as in claim 4, further comprising a supply voltage terminal, wherein the third transistor has a control terminal coupled to the supply voltage terminal.

6. A structure as in claim 4, further comprising a supply voltage terminal and a resistor, wherein the resistor is connected between the supply voltage terminal and a control terminal of the fourth transistor.

7. A structure as in claim 6, further comprising a fifth transistor having the second conductivity type and having a current path connected in series with the third and fourth transistors.

8. A structure as in claim 4, wherein the first and second transistors have the first conductivity type.

9. A structure as in claim 4, further comprising a resistor connected between the second control terminal and the reference terminal.

10. A structure as in claim 4, wherein the external terminal is a bond pad.

11. A structure as in claim 10, further comprising a protected circuit coupled to the bond pad.

12. A structure as in claim 11, wherein the protected circuit comprises a digital signal processing integrated circuit.

13. A structure as in claim 11, wherein the protected circuit comprises a dynamic random access memory circuit.

* * * * *